United States Patent
Guilford et al.

(10) Patent No.: US 9,871,535 B2
(45) Date of Patent: *Jan. 16, 2018

(54) HETEROGENEOUS COMPRESSION ARCHITECTURE FOR OPTIMIZED COMPRESSION RATIO

(71) Applicant: Intel Corporation, Santa Clara, CA (US)

(72) Inventors: James D. Guilford, Northborough, MA (US); Vinodh Gopal, Westborough, MA (US); Gilbert M. Wolrich, Framingham, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/393,599

(22) Filed: Dec. 29, 2016

(65) Prior Publication Data

US 2017/0111059 A1    Apr. 20, 2017

Related U.S. Application Data

(63) Continuation of application No. 14/866,115, filed on Sep. 25, 2015, now Pat. No. 9,537,504.

(51) Int. Cl.
  *H03M 7/34* (2006.01)
  *H03M 7/40* (2006.01)
  *H03M 7/30* (2006.01)

(52) U.S. Cl.
  CPC .............. *H03M 7/40* (2013.01); *H03M 7/30* (2013.01); *H03M 7/3086* (2013.01)

(58) Field of Classification Search
  CPC ......... H03M 7/40; H03M 7/30; H03M 7/3086
  (Continued)

(56) References Cited

U.S. PATENT DOCUMENTS 5,353,024 A    10/1994  Graybill
5,659,737 A     8/1997  Matsuda
(Continued)

FOREIGN PATENT DOCUMENTS

EP    0691628 A2    1/1996
EP    0734126 A1    9/1996

OTHER PUBLICATIONS

PCT International Search Report and Written Opinion for PCT/US2016/044303, dated Nov. 1, 2016, 13 pages.
(Continued)

*Primary Examiner* — Brian Young
(74) *Attorney, Agent, or Firm* — Lowenstein Sandler LLP

(57) ABSTRACT

A processing device includes an accelerator circuit to identify a byte in a byte stream, determine whether a first byte string starting from a first byte position of the byte matches a second byte string starting from a second byte position, responsive to determining that the first byte string matches the second byte string, generate a token comprising a first symbol encoding a length of the first byte string and a second symbol encoding a byte distance between the first byte position and the second byte position, and responsive to determining that the first byte string does not match another byte string, generate the token comprising the first symbol comprising the byte and a second symbol encoding a determined value.

20 Claims, 12 Drawing Sheets

(58) Field of Classification Search
USPC .......................................... 341/87, 106, 51
See application file for complete search history.

(56) References Cited

U.S. PATENT DOCUMENTS

| | | | |
|---|---|---|---|
| 6,741,368 B1* | 5/2004 | Hoel | H04N 1/00209 |
| | | | 358/1.9 |
| 7,233,265 B2 | 6/2007 | Cockburn et al. | |
| 7,536,399 B2* | 5/2009 | Itani | H03M 7/3086 |
| 9,372,887 B2* | 6/2016 | Doji | G11C 15/00 |
| 9,537,504 B1* | 1/2017 | Guilford | H03M 7/3086 |
| 9,628,111 B2* | 4/2017 | Henry | H03M 7/42 |
| 2009/0083267 A1 | 3/2009 | Johnson | |
| 2009/0322570 A1 | 12/2009 | Schneider | |
| 2014/0156790 A1 | 6/2014 | Gopal et al. | |

OTHER PUBLICATIONS

David A. Huffman, "A Method for the Construction of Minimum-Redundancy Codes", Proceedings of the I.R.E., Sep. 1952, 4 pages.
"RFC 1951—DEFLATE Compressed Data Format Specification version", faqs.org, May 1996, 15 pages.
Roger Sayle, "Improved GNU gzip Data Compression", Metaphorics EZ Object Model, Mar. 5, 1999, 14 pages.
Jacob Ziv, et al., "A Universal Algorithm for Sequential Data Compression", IEEE Transactions on Information Theory, vol. IT-23, No. 3, May 1977, 7 pages.

* cited by examiner

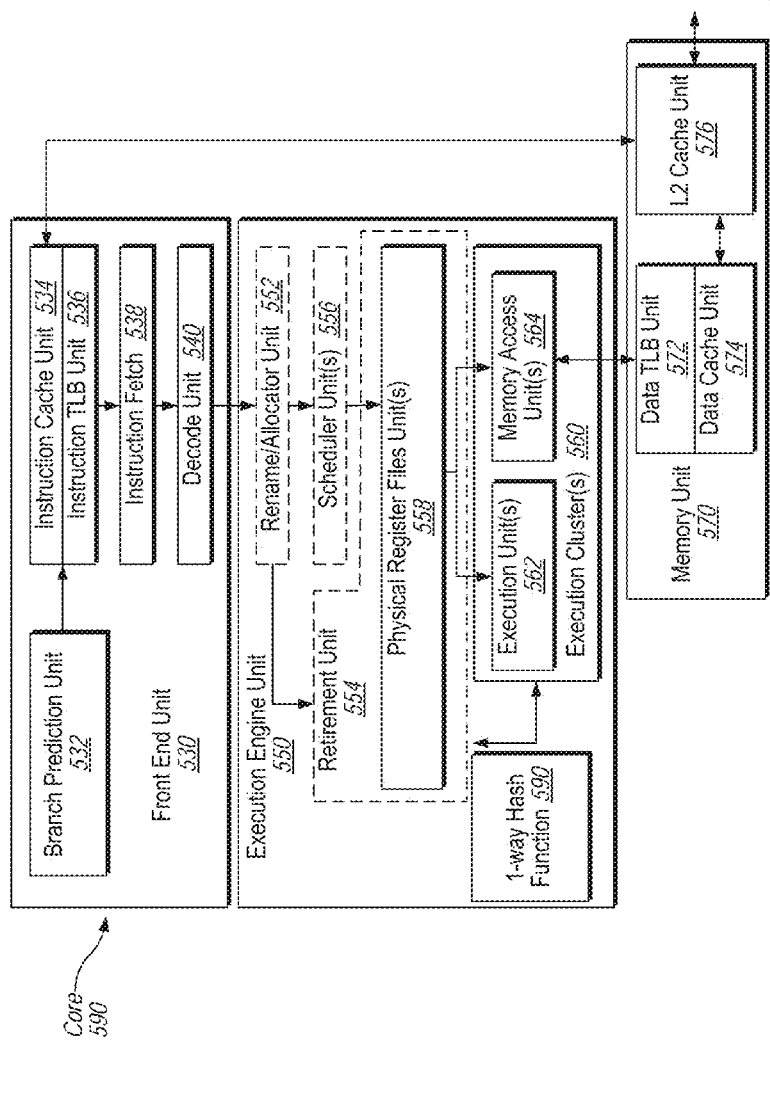
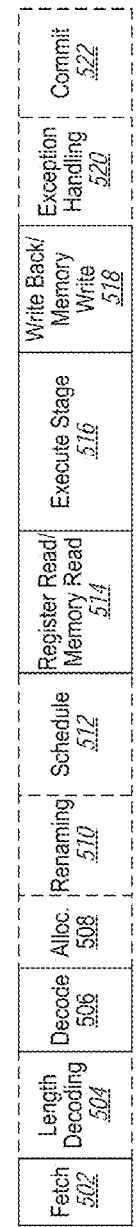
FIG. 5A
FIG. 5B

HETEROGENEOUS COMPRESSION ARCHITECTURE FOR OPTIMIZED COMPRESSION RATIO

RELATED APPLICATION

This application is a continuation of U.S. patent application Ser. No. 14/866,115, filed on Sep. 25, 2015, the entirety of which is incorporated herein by reference.

TECHNICAL FIELD

The embodiments of the disclosure relate generally to data compression and, more specifically, to a heterogeneous data compression architecture to achieve extreme compression ratio.

BACKGROUND

Data compression system and method convert input data into a compressed format to reduce the data size, thereby enabling efficient storage and transmission. The input data may contain a byte stream of bytes (referred to as a byte stream). The byte stream may be organized as a series of data blocks. Each data block includes data bytes arranged in a sequential order. Standard data compression methods may include a combination of a LZ77 string matcher and Huffman encoder to produce a compressed format of the input data.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5A is a block diagram illustrating a micro-architecture for a processor including heterogeneous core in which one embodiment of the disclosure may be used.

FIG. 5B is a block diagram illustrating an in-order pipeline and a register renaming stage, out-of-order issue/execution pipeline implemented according to at least one embodiment of the disclosure.

DETAILED DESCRIPTION

Figure 1:
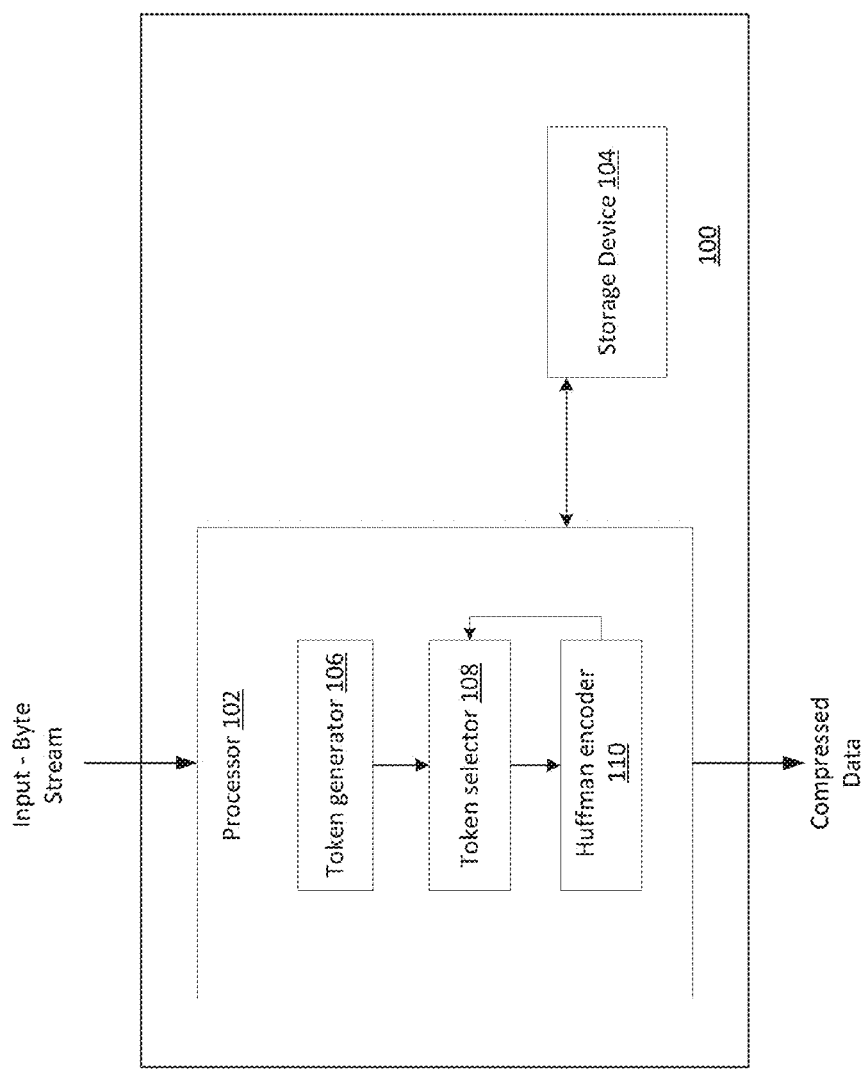
FIG. 1 illustrates a processing device including a processor to perform data compression according to an embodiment of the present disclosure.

The LZ77 string matcher, implemented in hardware or software, replaces repeated occurrences of data with references to a single copy of that data existing earlier in the uncompressed data stream. In some implementations, the LZ77 string matcher identifies repeated substrings of bytes in the byte stream and replaces the identified repeated substrings with backward references. A byte substring includes two or more consecutive bytes in a stream of bytes (referred to as a byte stream). Two byte substrings are repeated or matching if the two substrings are identical. A backward reference may include a length of the identified repeated substring and a byte distance between the identified substring and the prior matching substring. The length of a substring can be measured in terms of the number of bytes in the substring, and the byte distance can be measured in terms of the number of bytes between the corresponding byte positions for the two matching substrings in the byte stream. If the LZ77 string matcher cannot identify a repeated substring starting at a byte position, the data byte is represented in the output stream by the literal byte. Thus, the LZ77 string matcher converts the input byte stream into a token stream including a series of variable-length tokens, such that each token can store a backward reference of a repeated byte substring with a substring length or a literal byte. The number of token in the token stream is smaller than the number of bytes in the corresponding byte stream because the backward references eliminate occurrences of repeated substrings. A variable-length encoder, such as the Huffman encoder, may then encode the series of tokens and convert the input data into the compressed data format.

Because the tokens in the token stream generated by the LZ77 string matcher have variable lengths, the bits (the number of bits used to encode is also referred to as the cost) used to encode these tokens by the variable-length encoder (such as "Huffman coder") depend on not only the number of tokens identified by the LZ77 string matcher, but also the number of bits used to encode each token. Thus, a shorter token stream generated by a LZ77 string matcher may not result in a better compressed data output because it is possible to take more bits to encode each token in the shorter token stream.

The LZ77 string matcher may be carried out at different levels of sophistications, depending on the maximum string length that the LZ77 string matcher searches for. For example, the level of string matching for the LZ77 string matcher may range from level 1 to 9, whereas a level-1 LZ77 string matcher searches for substring matches up to a small string length (e.g., four byte long) and a level-9 LZ77 string matcher searches for substring matches up to a large string length (e.g., thirteen byte long). The higher level a LZ77 string matcher is at, the more processing resources are required.

A "lazy matching" method may be utilized to improve the search for substring matches. In the "lazy matching," after identifying the longest substring match for a current byte and the substring is followed by a literal byte in the byte stream, the "lazy" LZ77 string matcher looks at the next byte following the current byte in the byte stream to determine if a longer substring match exists for the next byte. If the longer match exists, the "lazy" LZ77 string matcher does not generate a backward reference token for the current byte in favor of the next byte. The "lazy" LZ77 string matcher uses heuristics derived from bytes neighboring the current byte to select tokens and thus fails to consider the global characteristics of the byte stream. Thus, current LZ77 string matchers cannot reliably produce the best data compression for the input data because they do not take into consideration all the bits needed to encode the byte stream.

Instead of making a selection of matching byte substrings based on local characteristics around a current byte, embodiments of the present disclosure make the selection based on a measurement of the overall number of bits to encode the input data. Towards that end, embodiments of the present disclosure identify the matching byte substring (such as the longest matching byte substring) for each byte in the input byte stream and generate a token for each byte in the byte stream. Embodiments assign a cost measurement associated with the Huffman encoder to the token, whereas the cost measurement may be a cost function that measures the number of bits employed to encode symbols associated with the token. An optimal set of tokens is then selected according to certain cost criteria, taking into consideration multiple possible combinations of tokens.

FIG. 1 illustrates a processing device 100 including a processor to perform data compression according to an embodiment of the present disclosure. The processing device 100 may include a processor 102 and a storage device 104 that is operably coupled to the processor 102. Processor 102 may further include one or more processing cores (not shown) that may be configured to execute instructions of data compression. The storage device 104 may be a suitable type of storage device to store data either in an uncompressed format or in a compressed format.

In one embodiment, the processor 102 may receive input data in an uncompressed format to be converted into a compressed format. The input data include a stream of bytes (or a byte stream) arranged according to a sequential order. Thus, each byte in the byte stream may be referred to by a byte position with respect to a reference byte (e.g., the first byte of the byte stream). The byte position represents the number of bytes to the reference byte and can be measured according to how may bytes away from the reference byte. In some embodiments, the bytes in the byte stream may be organized into data blocks, each of which may have predetermined sizes (e.g., a data block may contain 16K, 32K, or 64K bytes). Thus, a byte stream may include a certain number of data blocks of bytes.

In one embodiment, responsive to receiving the input data comprising the byte stream, the processor 102 may be associated with a token generator 106 to generate a token stream that includes one or more tokens for each byte in the byte stream. Token generator 106 can be a hardware logic (referred to as a functional processing unit) that is configured to generate the token stream. A token may contain a backward reference for a matching byte substring (such as the longest matching substring) if there is a matching or a literal byte if there is no matching. In contrast to the LZ77 string matcher, the token generator 106 performs substring matching for each byte in the byte stream. The processor 102 may further execute a token selector 108 to select a set of tokens according to certain global cost criteria. The selected set of tokens is an optimal representation of the byte stream according to the cost criteria. The processor 102 may then execute a Huffman encoder 110 to encode the selected set of tokens and produce the compressed data output.

The token generator 106 performs the computation to search for the matching byte substring for each byte in the byte stream. In one embodiment, the matching byte substring is the longest byte substring originating from the current byte that matches to a prior byte substring originating from a byte prior to the current byte. In one embodiment, as shown in FIG. 1, the processor 102 may execute a software application on the processor 102 to perform the operations of the token generator 106. In another embodiment, as shown in FIG. 2, the processor 102 may work cooperatively with a hardware processing engine 112 that implements, in hardware, the operations of the token generator 106.

Figure 2:
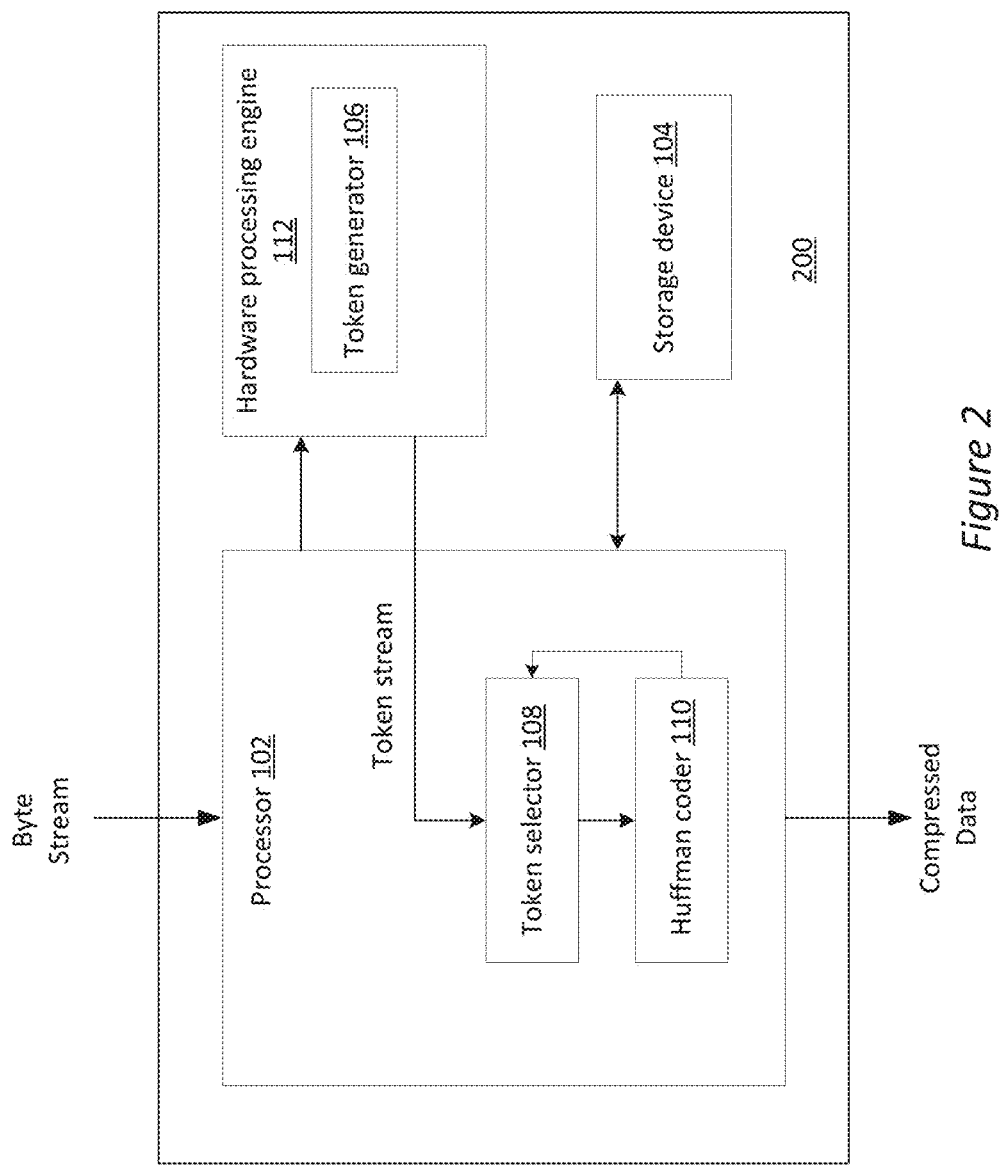
FIG. 2 illustrates a heterogeneous system including a processor and a hardware processing engine to perform data compression according to an embodiment of the present disclosure.

FIG. 2 illustrates a heterogeneous system 200 including a processor 102 and a hardware processing engine 112 to perform data compression according to an embodiment of the present disclosure. In one embodiment, the heterogeneous system 200 may be a system-on-a-chip (SoC) that may include the processor 102, storage device 104, and the hardware processing engine 112. The processor 102 and storage device 104 may be the same or similar devices as shown in FIG. 1. The hardware processing engine 112 may include a logic circuit fabricated to perform the function of searching for the matching byte substring for each byte and generate a token stream including one or more tokens for the each byte in the byte stream. In one embodiment, the hardware processing engine 112 may be arranged on a chipset that is communicatively coupled to one or more sockets of the processor 102. Thus, as shown in FIG. 2, processor 102 may receive the input data including the byte stream and transmit the byte stream to the hardware processing engine 112 that may calculate the token stream based on the byte stream. The hardware processing engine 112 may store the generated token stream in a buffer (not shown) and send a signal to inform the processor 102 that the token stream is ready. In response, the processor 102 may retrieve the token stream from the hardware processing engine 112 for further processing.

Either implemented in hardware as shown in FIG. 2 or in software as shown in FIG. 1, token generator 106 may receive the byte stream of the input data and generate a corresponding token stream. In one embodiment, for every byte in the byte stream, token generator 106 may search for a longest byte substring originating from the current byte and matching to another byte substring originating at a byte prior to the current byte in the byte stream. In one embodiment, token generator 106 may search for the longest byte substring within a range of byte lengths. For example, the token generator 106 may search for a prior matching byte substring within the string length range of [3 bytes, 13 bytes]. In another embodiment, token generator 106 may search for matching byte substring of longer than 3 bytes.

Token generator 106 may produce a token corresponding to the byte, whereas the token is a data object containing symbols to store information relating to the byte. For example, a symbol may be bits representing the length of a substring or a literal byte or a literal byte. Another symbol may be bits representing the byte distance to a reference byte. The information stored in the token corresponding to the byte may depend on whether token generator 106 has successfully located a matching byte substring. If token generator 106 cannot identify a prior matching byte substring for the current byte, token generator 106 may generate a token that contains a symbol representing the literal byte of the current byte. If, however, token generator 106 identifies a prior matching byte substring for the current byte, token generator 106 may generate a token containing a first symbol representing the byte string length (e.g., in terms of number of bytes) of the identified byte substring and a second symbol representing a byte distance between the matching byte substrings. The byte distance can be measured in terms of the number of bytes between the heads of the two matching byte substrings. In one embodiment, the token may be a 3-byte token in the form of <Symbol A, Symbol B>, whereas Symbol A may be one-byte long to represent a literal byte (if there is no matching substring) or a matching substring length (if there is a matching substring), and Symbol B may be two-byte long to represent the byte distance to a reference byte (if there is a matching substring).

Thus, each byte in the byte stream is associated with a respective token, and all the tokens form a token stream for the byte stream. The token stream may be stored in a buffer associated with hardware processing engine 112. Processor 102 may retrieve the token stream from the hardware processing engine 112 for further processing. In one embodiment, the token generator 106 may store only tokens that contain a matching byte substring, but not tokens for literal bytes. If processor 102 has access to the original input byte stream, processor 102 may generate those tokens containing literal byte from the original byte stream and insert those into the token stream at their rightful positions. In this way, the amount of data transmitting between processor 102 and hardware processing engine 106 may be reduced.

Upon receiving the generated token stream, processor 102 may execute token selector 108 to produce a subset of tokens representing the input byte stream. To this end, token selector 108 may first generate a graph using the tokens in the token stream and then select the subset of tokens based on the graph. In one embodiment, the graph may include a plurality of nodes interconnected by a plurality of edges. For each token in the token stream, token selector 108 may generate a corresponding node in the graph. For each node, token selector 108 generates a default edge linking the node to a subsequent node corresponding to the next token in the token stream. Further, if the token contains information of a matching byte substring originating from a prior byte, token selector 108 may generate an edge linking the node corresponding to the token of the current byte to another node corresponding to a prior token corresponding of the prior byte. Thus, each node in the graph may be associated with one or more edges.

In one embodiment, token selector 108 may assign an encoding cost to each edge in the graph. The encoding cost is the number of bits needed to encode the token associated with the node. Because the encoding cost associated with each edge is unknown before the encoding actually happens, token selector 108 may assign an estimated cost based on certain heuristics.

In one embodiment, a token may include a first symbol (S1) representing either the literal byte or the length of the matching substring and a second symbol (S2) representing the byte distance if the token is backward referenced to another token. The values of literal bytes, substring lengths, and byte distances may be represented by symbols along with zero or more extra bits specified by the encoding scheme. Thus, the cost to encode a token may include the costs to encode the symbols (S1, S2) plus the zero or more extra bits. The number of extra bits associated with a symbol may be determined according to certain mapping tables of the encoding scheme. Under a Huffman encoding scheme, a symbol (S1) represents a literal byte without the need for any extra bits. A symbol (S1) representing the value of a substring length may be associated with zero or more extra bits according to a first mapping table that maps the value to extra bits. For example, according to the first mapping table, a length of 11 is represented by a symbol of "265" with no extra bit, and a length of 12 is represented by the same symbol of "265" with one extra bit. Similarly, a symbol (S2) representing the value of a byte distance may be associated with zero or more extra bits according to a second mapping table. In one embodiment, the second mapping table may map the value of a byte distance up to 13 extra bits.

The extra bits associated with symbols (S1, S2) are not encoded and can be ascertained according to the mapping tables based on the literal byte, substring lengths, or byte distances contained in tokens. However, the exact number of bits used to encode these symbols (S1, S2) is not known until after the Huffman encoding. In one embodiment, token selector 108 may estimate the number of bits used to encode these symbols according certain estimation formula. For example, in one embodiment, the number of bits for encoding is estimated as a function of which block the token is in. As discussed before, the byte stream (or similarly, the token stream) may be organized according to a sequence of data blocks of bytes (or tokens). The sizes of blocks may be pre-determined. For example, the first block may include 16 k bytes (or tokens) and each subsequent block may include 64 k bytes (or tokens). For symbols representing substring lengths in the first block of the token stream, assuming a minimum substring length of 3, the length of 3 is assigned a 3 bit estimate. The number of assigned bits increases linearly to 13 bits up to a substring length of 29 in the first block. Length longer than 13 is flatten out with 13 bits. For symbols representing substring lengths in the blocks subsequent to the first block, the length of 3 is also assigned a 3 bit estimate. But, the number of assigned bits increases linearly to 13 bits for the length of 43 before it levels out at 13 bits. Further, all the symbols representing the byte distance are assigned a 5 bit estimate. The symbols representing a literal byte may be assigned an 8.5 bit of average cost estimate in the first block, and 9.5 bit of average cost estimate in subsequent blocks. The assigned bit estimates as provided above are examples. Other assigned estimates can be used as well.

Thus, each edge may be assigned a cost indicating the estimated bits (including the assigned bit estimates to encode symbols of the token and the extra bits associated with the symbols) to perform encoding using the nodes (or the corresponding tokens) connected by the edge. In one embodiment, token selector 108 may traverse the graph using a suitable graph traversal method (e.g., breadth-first traversal and depth first traversal methods) to determine a path that contains edges linking nodes from a first end of the graph to a second end of the graph. In one embodiment, the determined path is selected using least-cost criteria or the least number of estimated bits to encode the symbols along the path. The least-cost criteria may determine the path that has the least cumulated costs along the path among all potential paths between the two ends using, for example, the Dijkstra's algorithm or the Floyd-Warshall algorithm. The first end and the second end can correspond to the beginning token or the termination token in the token stream. Thus, token selector 108 may select the set of tokens corresponding to the nodes along the determined path and provide the selected set of tokens to Huffman encoder 110 to carry out the encoding and generate an output that is a compressed version of the input data.

Huffman encoder 110 can be a suitable implementation of a variable-length encoder designed to encode the selected set of tokens (or the symbols stored therein). Because the first traversal of the graph is based on estimated costs assigned to edges, the selected set of tokens is potentially not the best selection. In one embodiment, after the Huffman coding 110, the cost associated with edges along the path may be updated with the actual number of bits used by the Huffman coder 110 to encode symbols in tokens along the path. Token selector 108 may then traverse the graph again based on the updated costs assigned to edges in the graph to determine a second path in the graph. Token selector 108 may then select a second set of tokens along the second path and provide the Huffman encoder 110 for a second pass of encoding and generate another output data that is another compressed version of the input data.

In one embodiment, the size of the second output data is compared to the size of the first output data to determine whether further iterations of graph traversal and Huffman coding is needed. In one embodiment, if a ratio of the size difference between the second output and the size of the first output over the size of the first output is smaller than a threshold (e.g., 10%), the iteration is stopped. Otherwise, the iteration may continue until the ratio meets the termination threshold.

Figure 3:
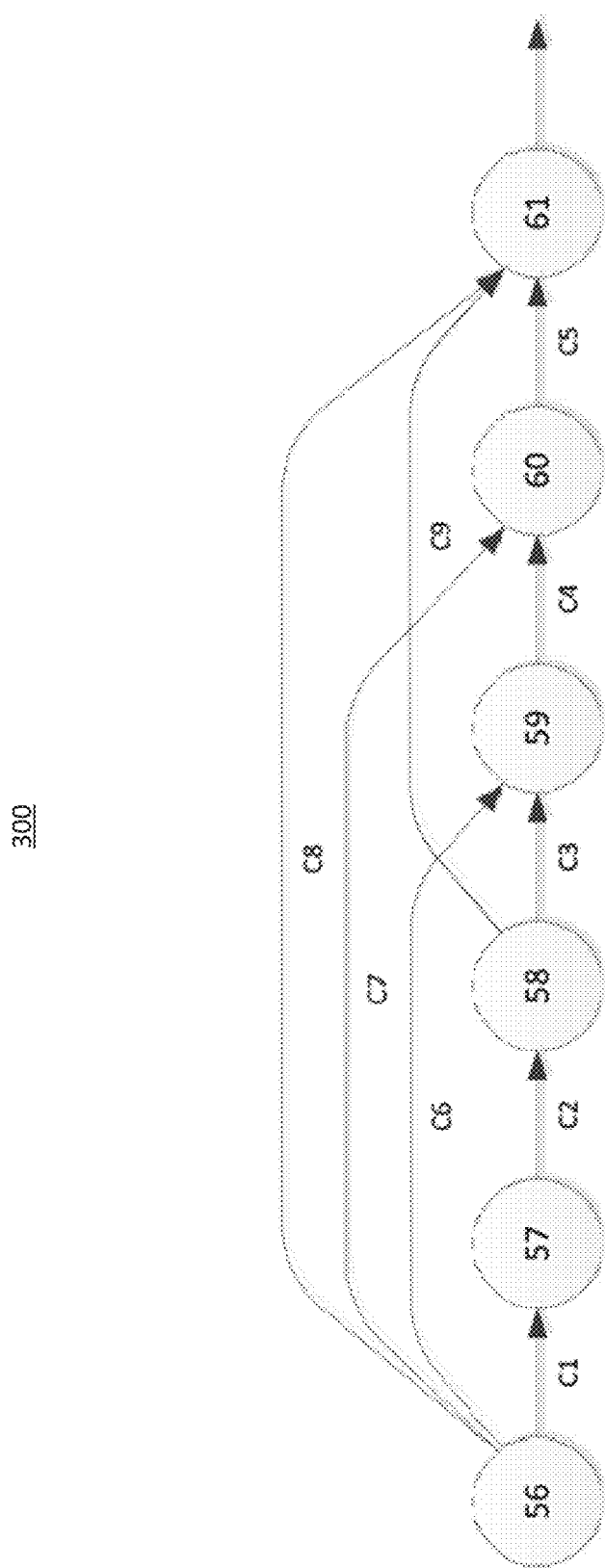
FIG. 3 illustrates an exemplary portion of a cost graph according to an embodiment of the present disclosure.

FIG. 3 illustrates an exemplary portion of a graph 300 generated by a token selector according to an embodiment of the present disclosure. As shown in FIG. 3, graph 300 may include a portion (such as nodes 56-61 as shown in FIG. 3) corresponding to a portion of token positions 56-61 in a token stream which, in turn, correspond to byte positions 56-61 in the underlying byte stream. Prior to the Huffman encoding, each edge in the graph may be assigned with an estimated cost represented by labels C1-C9, whereas C1-C5 represent the cost to encode a literal byte, and C6-C9 represent the costs to encode tokens including a substring length and a byte distance. For simplicity, labels C1-C9 are used to represent both edges and the encoding costs associated the edges. Certain nodes (such as node 57) may be associated with edges (C1, C2) that are only connected to their adjacent nodes (nodes 56, 58). These he nodes correspond to tokens containing only a literal byte because a repeated substring is not identified at these positions. Other nodes may be associated with byte positions where one or more matching substrings have found. In this example, node 56 has a 5-byte match with node 61 and is therefore linked to node 61 with an edge (C8). Edges (C7, C6) may be inferred from edge (C8) because a longer match implies multiple shorter matches at the same byte position. For this example, the edges linking matching nodes (such as C6-C9) have a minimum length of three bytes. Although not shown, other edges from prior portion of the graph (such as nodes prior to node 56) may also be linked to these nodes, and nodes 56-61 may also link to nodes beyond node 61.

A suitable graph traversal algorithm may be used to identify a path linking a first node (e.g., node 1) of the graph to an end node of the graph. The path may be selected to pass through a selected subset of nodes via edges associated with the subset of nodes according to certain criteria (such as a least-cost criterion). The graph traversal may progress from node 1 to the end node, or vice versa. Node 1 may be assigned with an initial encoding cost for encoding a literal byte or a zero cost if a special dummy node is used as the node 1. The traversal can be viewed as a series of steps from an origination (referred to as a source node) to determine a destination (referred to as a destination node). A source node may be linked to a number of potential destination nodes through edges associated with the source node. All potential destination nodes that can be reached from the source node are given the cost to encode up to the source node plus the cost of the edge that leads these potential destination nodes. The least-cost destination node may become a new source node in a next step to seek a next destination node during the traversal. Thus, a least-cost path from the node 1 to the end node may be determined by traversing the graph based on the costs assigned to edges in the graph.

In one embodiment, token generator 106 produces not only the longest matching byte substring for a byte in the byte stream in a token, but also other types of matches in the token. For example, the token generator 106, in addition to identifying the longest matching substring of length, also identifies the closest match of length—1 byte and/or length—2 bytes etc. The additional information may be stored in the token provided to token selector 108. Token selector 108 may generate additional edges in the graph based on the additional information to improve the compression performance.

Figure 4:
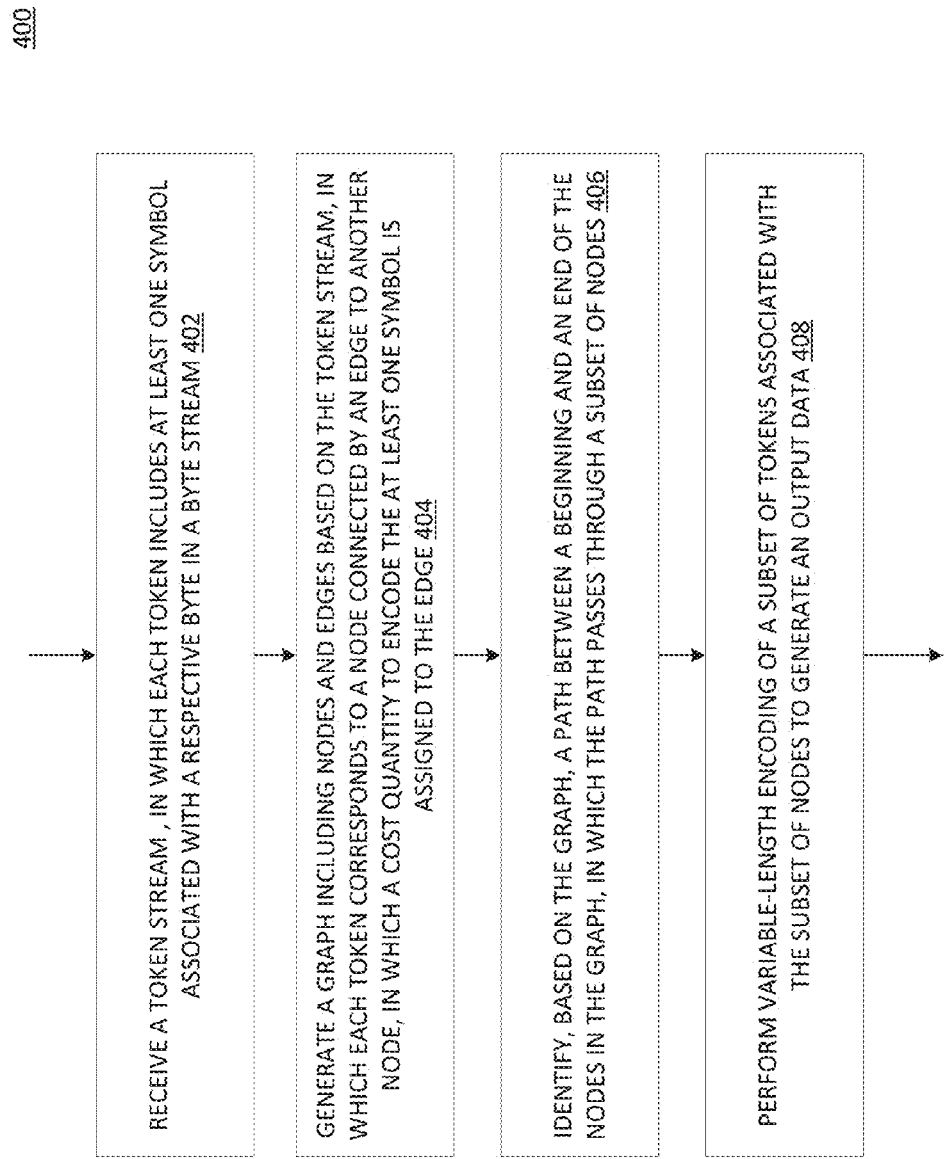
FIG. 4 is a block diagram of a method to perform data compression according to an embodiment of the present disclosure.

FIG. 4 is a block diagram of a method 400 to perform data compression according to an embodiment of the present disclosure. Method 400 may be performed by processing logic that may include hardware (e.g., circuitry, dedicated logic, programmable logic, microcode, etc.), software (such as instructions run on a processing device, a general purpose computer system, or a dedicated machine), firmware, or a combination thereof. In one embodiment, method 400 may be performed, in part, by processing logics of the processing device 102 as shown in FIG. 1.

For simplicity of explanation, the method 400 is depicted and described as a series of acts. However, acts in accordance with this disclosure can occur in various orders and/or concurrently and with other acts not presented and described herein. Furthermore, not all illustrated acts may be performed to implement the method 400 in accordance with the disclosed subject matter. In addition, those skilled in the art will understand and appreciate that the method 400 could alternatively be represented as a series of interrelated states via a state diagram or events.

Referring to FIG. 4, at 402, the processor may receive a token stream including tokens generated from a byte stream. In one embodiment, the token stream may have been calculated by a functional processing engine operably coupled to the processor based on the byte stream received by the processor. Alternatively, the token stream may be calculated by the processor by executing software applications based on the received byte stream. Each token in the token stream may correspond to a byte in the byte stream, and each token may contain a first symbol including a length of a first byte substring if the first byte substring matches to a second byte substring situated prior to the first bye substring or including a literal byte if the first byte substring does not have a matching second byte substring. The token may contain a second symbol including a byte distance between the first byte substring and the second byte substring. The byte distance is zero if there is no matching second byte substring.

At 404, in response to receiving the token stream, the processor may generate a graph including nodes and edges. Each node in the graph may correspond to a token in the token stream. If a token contains symbols indicating that the token contains information between a first byte substring and a second matching byte substring, the processor may generate an edge to link the first token corresponding to the starting byte of the first byte substring and the second token corresponding to the starting byte of the second byte substring. The processor may associate an encoding cost with the edge. The encoding cost is an estimate of how many bits are needed to encode symbols associated the first token. Thus, each edge is the graph is associated with an estimate cost.

At 406, the processor may, based on the graph, identify a path between a beginning token of the token stream and an end node associated with a last token of the token stream according to certain criteria. In one embodiment, the criteria may include a least-cost criterion that selects the path of the least total accumulated cost (or bits used to encode symbols associated with nodes) along the path. The path may passes through nodes corresponding to a subset of tokens that include backward references and literal bytes to sufficiently represent the input byte stream.

At 408, the processor may perform variable-length encoding (such as Huffman coding) of the identified subset of tokens corresponding to the nodes on the path to generate an output as a compressed version of the input data.

FIG. 5A is a block diagram illustrating a micro-architecture for a processor 500 that implements the processing device including heterogeneous cores in accordance with one embodiment of the disclosure. Specifically, processor 500 depicts an in-order architecture core and a register renaming logic, out-of-order issue/execution logic to be included in a processor according to at least one embodiment of the disclosure.

Processor 500 includes a front end unit 530 coupled to an execution engine unit 550, and both are coupled to a memory unit 570. The processor 500 may include a reduced instruction set computing (RISC) core, a complex instruction set computing (CISC) core, a very long instruction word (VLIW) core, or a hybrid or alternative core type. As yet another option, processor 500 may include a special-purpose core, such as, for example, a network or communication core, compression engine, graphics core, or the like. In one embodiment, processor 500 may be a multi-core processor or may part of a multi-processor system.

The front end unit 530 includes a branch prediction unit 532 coupled to an instruction cache unit 534, which is coupled to an instruction translation lookaside buffer (TLB) 536, which is coupled to an instruction fetch unit 538, which is coupled to a decode unit 540. The decode unit 540 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 540 may be implemented using various different mechanisms. Examples of suitable mechanisms include, but are not limited to, look-up tables, hardware implementations, programmable logic arrays (PLAs), microcode read only memories (ROMs), etc. The instruction cache unit 534 is further coupled to the memory unit 570. The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations (RS), central instruction window, etc. The scheduler unit(s) 556 is coupled to the physical register file(s) unit(s) 558. Each of the physical register file(s) units 558 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 558 is overlapped by the retirement unit 554 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

In one implementation, processor 500 may be the same as processor 102 described with respect to FIG. 1A.

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 554 and the physical register file(s) unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 556, physical register file(s) unit(s) 558, and execution cluster(s) 560 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 564). It should also be understood that where separate pipelines are used, one or more of these pipelines may be out-of-order issue/execution and the rest in-order.

The set of memory access units 564 is coupled to the memory unit 570, which may include a data prefetcher 580, a data TLB unit 572, a data cache unit (DCU) 574, and a level 2 (L2) cache unit 576, to name a few examples. In some embodiments DCU 574 is also known as a first level data cache (L1 cache). The DCU 574 may handle multiple outstanding cache misses and continue to service incoming stores and loads. It also supports maintaining cache coherency. The data TLB unit 572 is a cache used to improve virtual address translation speed by mapping virtual and physical address spaces. In one exemplary embodiment, the memory access units 564 may include a load unit, a store address unit, and a store data unit, each of which is coupled to the data TLB unit 572 in the memory unit 570. The L2 cache unit 576 may be coupled to one or more other levels of cache and eventually to a main memory.

In one embodiment, the data prefetcher 580 speculatively loads/prefetches data to the DCU 574 by automatically predicting which data a program is about to consume. Prefeteching may refer to transferring data stored in one memory location of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 500 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 5B is a block diagram illustrating an in-order pipeline and a register renaming stage, out-of-order issue/execution pipeline implemented by processing device 500 of FIG. 5A according to some embodiments of the disclosure. The solid lined boxes in FIG. 5B illustrate an in-order pipeline, while the dashed lined boxes illustrates a register renaming, out-of-order issue/execution pipeline. In FIG. 5B, a processor pipeline 500 includes a fetch stage 502, a length decode stage 504, a decode stage 506, an allocation stage 508, a renaming stage 510, a scheduling (also known as a dispatch or issue) stage 512, a register read/memory read stage 514, an execute stage 516, a write back/memory write stage 518, an exception handling stage 522, and a commit stage 524. In some embodiments, the ordering of stages 502-524 may be different than illustrated and are not limited to the specific ordering shown in FIG. 5B.

Figure 6:
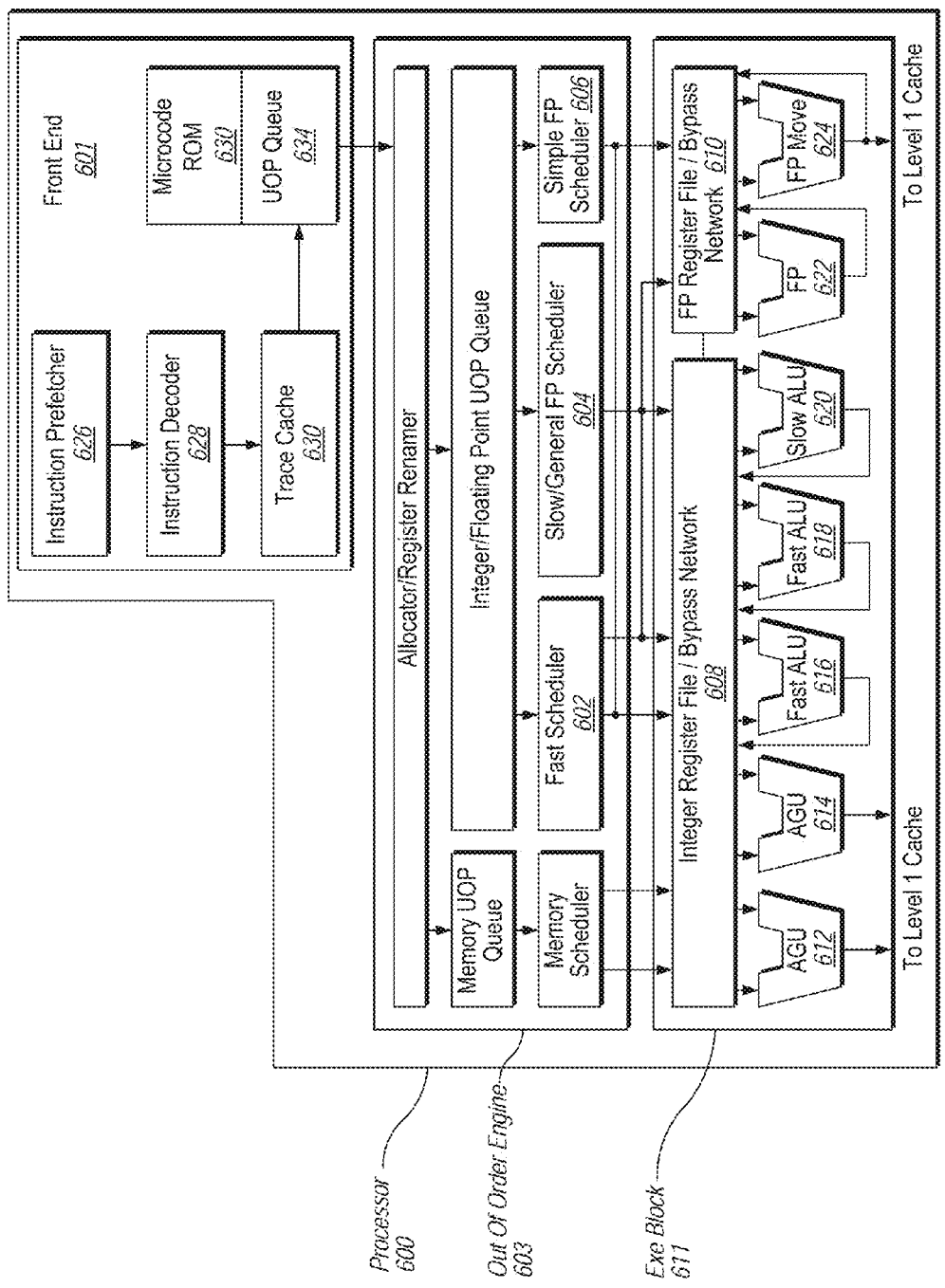
FIG. 6 illustrates a block diagram of the micro-architecture for a processor that includes logic in accordance with one embodiment of the disclosure.

FIG. 6 illustrates a block diagram of the micro-architecture for a processor 600 that includes hybrid cores in accordance with one embodiment of the disclosure. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 601 is the part of the processor 600 that fetches instructions to be executed and prepares them to be used later in the processor pipeline.

The front end 601 may include several units. In one embodiment, the instruction prefetcher 626 fetches instructions from memory and feeds them to an instruction decoder 628 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 630 takes decoded uops and assembles them into program ordered sequences or traces in the uop queue 634 for execution. When the trace cache 630 encounters a complex instruction, the microcode ROM 632 provides the uops needed to complete the operation.

Some instructions are converted into a single micro-op, whereas others need several micro-ops to complete the full operation. In one embodiment, if more than four micro-ops are needed to complete an instruction, the decoder 628 accesses the microcode ROM 632 to do the instruction. For one embodiment, an instruction can be decoded into a small number of micro ops for processing at the instruction decoder 628. In another embodiment, an instruction can be stored within the microcode ROM 632 should a number of micro-ops be needed to accomplish the operation. The trace cache 630 refers to an entry point programmable logic array (PLA) to determine a correct micro-instruction pointer for reading the micro-code sequences to complete one or more instructions in accordance with one embodiment from the micro-code ROM 632. After the microcode ROM 632 finishes sequencing micro-ops for an instruction, the front end 601 of the machine resumes fetching micro-ops from the trace cache 630.

The out-of-order execution engine 603 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 602, slow/general floating point scheduler 604, and simple floating point scheduler 606. The uop schedulers 602, 604, 606, determine when a uop is ready to execute based on the readiness of their dependent input register operand sources and the availability of the execution resources the uops need to complete their operation. The fast scheduler 602 of one embodiment can schedule on each half of the main clock cycle while the other schedulers can only schedule once per main processor clock cycle. The schedulers arbitrate for the dispatch ports to schedule uops for execution.

Register files 608, 610, sit between the schedulers 602, 604, 606, and the execution units 612, 614, 616, 618, 620, 622, 624 in the execution block 611. There is a separate register file 608, 610, for integer and floating point operations, respectively. Each register file 608, 610, of one embodiment also includes a bypass network that can bypass or forward just completed results that have not yet been written into the register file to new dependent uops. The integer register file 608 and the floating point register file 610 are also capable of communicating data with the other. For one embodiment, the integer register file 608 is split into two separate register files, one register file for the low order 32 bits of data and a second register file for the high order 32 bits of data. The floating point register file 610 of one embodiment has 128 bit wide entries because floating point instructions typically have operands from 64 to 128 bits in width.

The execution block 611 contains the execution units 612, 614, 616, 618, 620, 622, 624, where the instructions are actually executed. This section includes the register files 608, 610, that store the integer and floating point data operand values that the micro-instructions need to execute. The processor 600 of one embodiment is comprised of a number of execution units: address generation unit (AGU) 612, AGU 614, fast ALU 616, fast ALU 618, slow ALU 620, floating point ALU 622, floating point move unit 624. For one embodiment, the floating point execution blocks 622, 624, execute floating point, MMX, SIMD, and SSE, or other operations. The floating point ALU 622 of one embodiment includes a 64 bit by 64 bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 616, 618. The fast ALUs 616, 618, of one embodiment can execute fast operations with an effective latency of half a clock cycle. For one embodiment, most complex integer operations go to the slow ALU 620 as the slow ALU 620 includes integer execution hardware for long latency type of operations, such as a multiplier, shifts, flag logic, and branch processing. Memory load/store operations are executed by the AGUs 612, 614. For one embodiment, the integer ALUs 616, 618, 620, are described in the context of performing integer operations on 64 bit data operands. In alternative embodiments, the ALUs 616, 618, 620, can be implemented to support a variety of data bits including 16, 32, 128, 256, etc. Similarly, the floating point units 622, 624, can be implemented to support a range of operands having bits of various widths. For one embodiment, the floating point units 622, 624, can operate on 128 bits wide packed data operands in conjunction with SIMD and multimedia instructions.

In one embodiment, the uops schedulers 602, 604, 606, dispatch dependent operations before the parent load has finished executing. As uops are speculatively scheduled and executed in processor 600, the processor 600 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 600 also includes logic to implement store address prediction for memory disambiguation according to embodiments of the disclosure. In one embodiment, the execution block 611 of processor 600 may include a store address predictor (not shown) for implementing store address prediction for memory disambiguation.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions below, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 7:
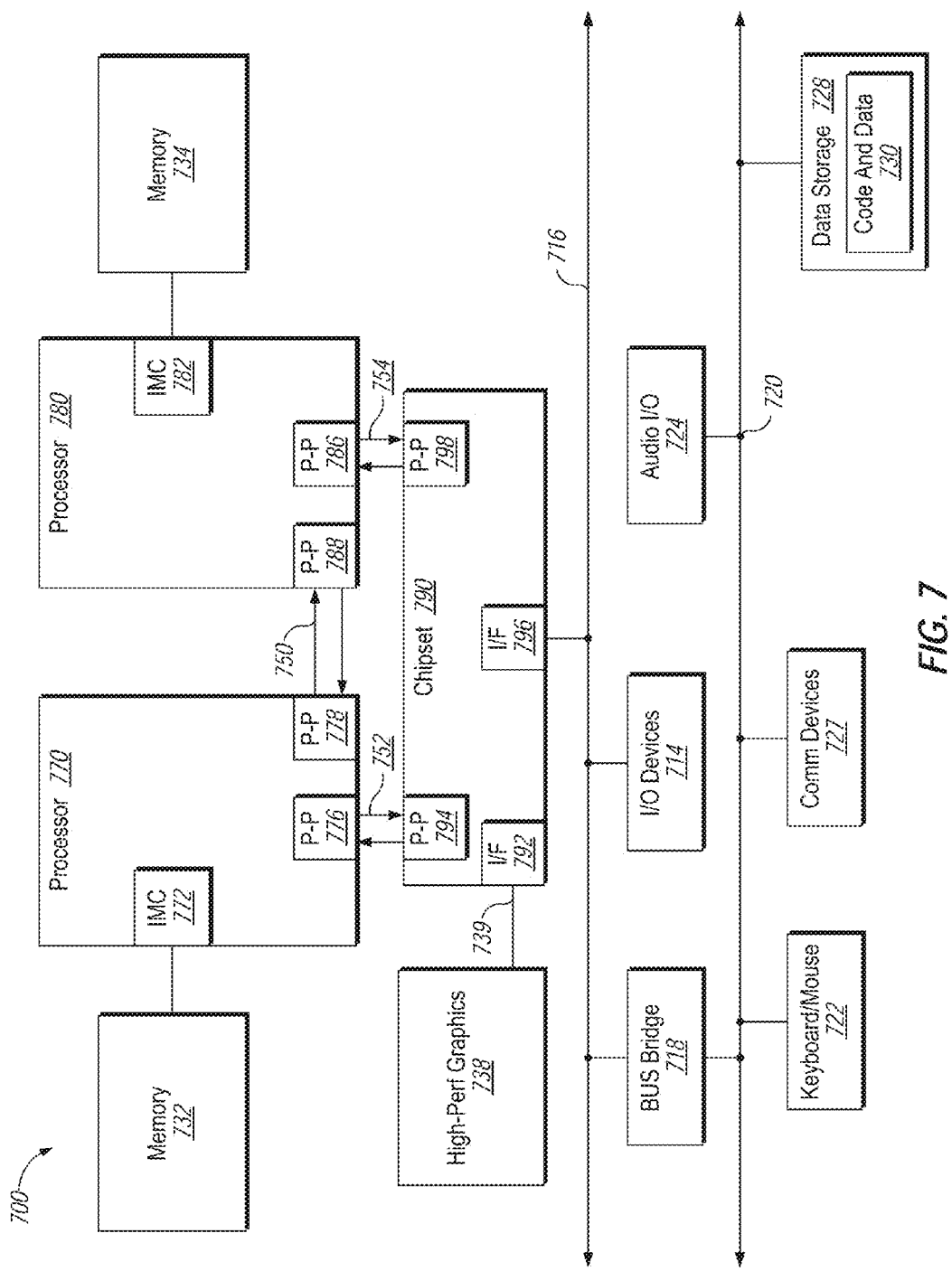
FIG. 7 is a block diagram illustrating a system in which an embodiment of the disclosure may be used.

Referring now to FIG. 7, shown is a block diagram illustrating a system 700 in which an embodiment of the disclosure may be used. As shown in FIG. 7, multiprocessor system 700 is a point-to-point interconnect system, and includes a first processor 770 and a second processor 780 coupled via a point-to-point interconnect 750. While shown with only two processors 770, 780, it is to be understood that the scope of embodiments of the disclosure is not so limited. In other embodiments, one or more additional processors may be present in a given processor. In one embodiment, the multiprocessor system 700 may implement hybrid cores as described herein.

Processors 770 and 780 are shown including integrated memory controller units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures are possible. For example, instead of the point-to-point architecture of FIG. 7, a system may implement a multi-drop bus or other such architecture.

Figure 8:
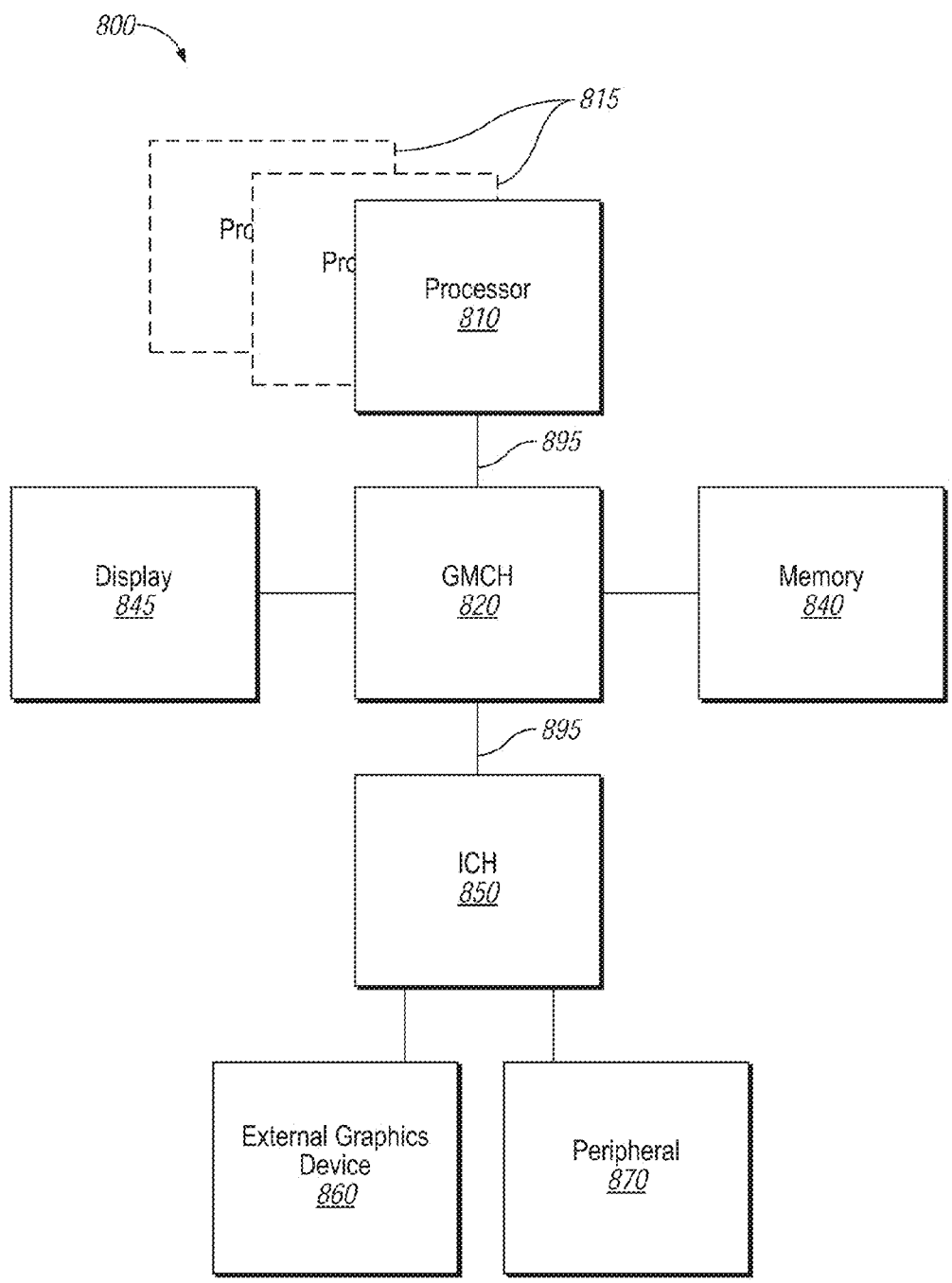
FIG. 8 is a block diagram of a system in which an embodiment of the disclosure may operate.

Referring now to FIG. 8, shown is a block diagram of a system 800 in which one embodiment of the disclosure may operate. The system 800 may include one or more processors 810, 815, which are coupled to graphics memory controller hub (GMCH) 820. The optional nature of additional processors 815 is denoted in FIG. 8 with broken lines. In one embodiment, processors 810, 815 implement hybrid cores according to embodiments of the disclosure.

Each processor 810, 815 may be some version of the circuit, integrated circuit, processor, and/or silicon integrated circuit as described above. However, it should be noted that it is unlikely that integrated graphics logic and integrated memory control units would exist in the processors 810, 815. FIG. 8 illustrates that the GMCH 820 may be coupled to a memory 840 that may be, for example, a dynamic random access memory (DRAM). The DRAM may, for at least one embodiment, be associated with a non-volatile cache.

The GMCH 820 may be a chipset, or a portion of a chipset. The GMCH 820 may communicate with the processor(s) 810, 815 and control interaction between the processor(s) 810, 815 and memory 840. The GMCH 820 may also act as an accelerated bus interface between the processor(s) 810, 815 and other elements of the system 800. For at least one embodiment, the GMCH 820 communicates with the processor(s) 810, 815 via a multi-drop bus, such as a frontside bus (FSB) 895.

Furthermore, GMCH 820 is coupled to a display 845 (such as a flat panel or touchscreen display). GMCH 820 may include an integrated graphics accelerator. GMCH 820 is further coupled to an input/output (I/O) controller hub (ICH) 850, which may be used to couple various peripheral devices to system 800. Shown for example in the embodiment of FIG. 8 is an external graphics device 860, which may be a discrete graphics device, coupled to ICH 850, along with another peripheral device 870.

Alternatively, additional or different processors may also be present in the system 800. For example, additional processor(s) 815 may include additional processors(s) that are the same as processor 810, additional processor(s) that are heterogeneous or asymmetric to processor 810, accelerators (such as, e.g., graphics accelerators or digital signal processing (DSP) units), field programmable gate arrays, or any other processor. There can be a variety of differences between the processor(s) 810, 815 in terms of a spectrum of metrics of merit including architectural, micro-architectural, thermal, power consumption characteristics, and the like. These differences may effectively manifest themselves as asymmetry and heterogeneity amongst the processors 810, 815. For at least one embodiment, the various processors 810, 815 may reside in the same die package.

Figure 9:
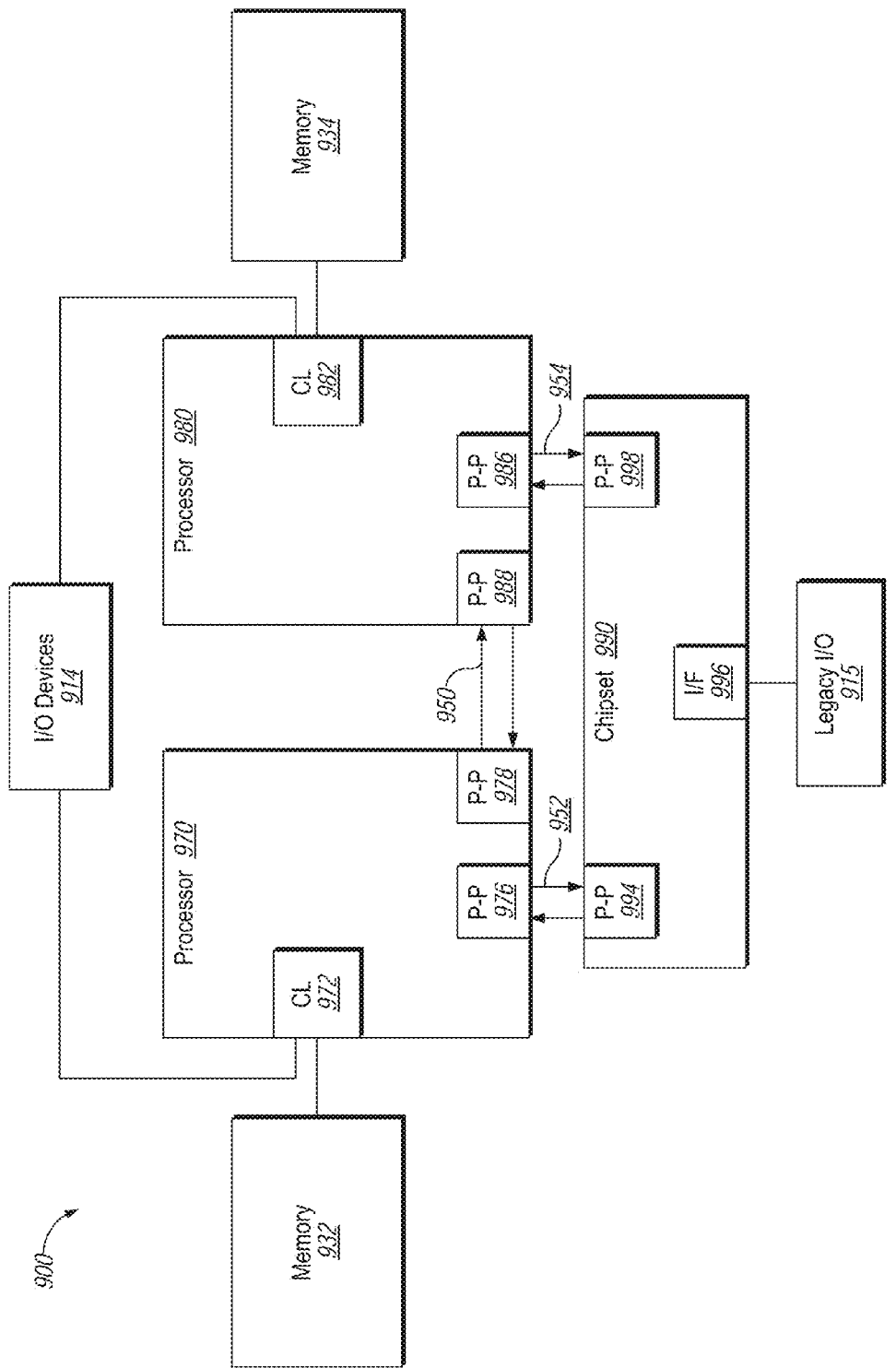
FIG. 9 is a block diagram of a system in which an embodiment of the disclosure may operate.

Referring now to FIG. 9, shown is a block diagram of a system 900 in which an embodiment of the disclosure may operate. FIG. 9 illustrates processors 970, 980. In one embodiment, processors 970, 980 may implement hybrid cores as described above. Processors 970, 980 may include integrated memory and I/O control logic ("CL") 972 and 982, respectively and intercommunicate with each other via point-to-point interconnect 950 between point-to-point (P-P) interfaces 978 and 988 respectively. Processors 970, 980 each communicate with chipset 990 via point-to-point interconnects 952 and 954 through the respective P-P interfaces 976 to 994 and 986 to 998 as shown. For at least one embodiment, the CL 972, 982 may include integrated memory controller units. CLs 972, 982 may include I/O control logic. As depicted, memories 932, 934 coupled to CLs 972, 982 and I/O devices 914 are also coupled to the control logic 972, 982. Legacy I/O devices 915 are coupled to the chipset 990 via interface 996.

Figure 10:
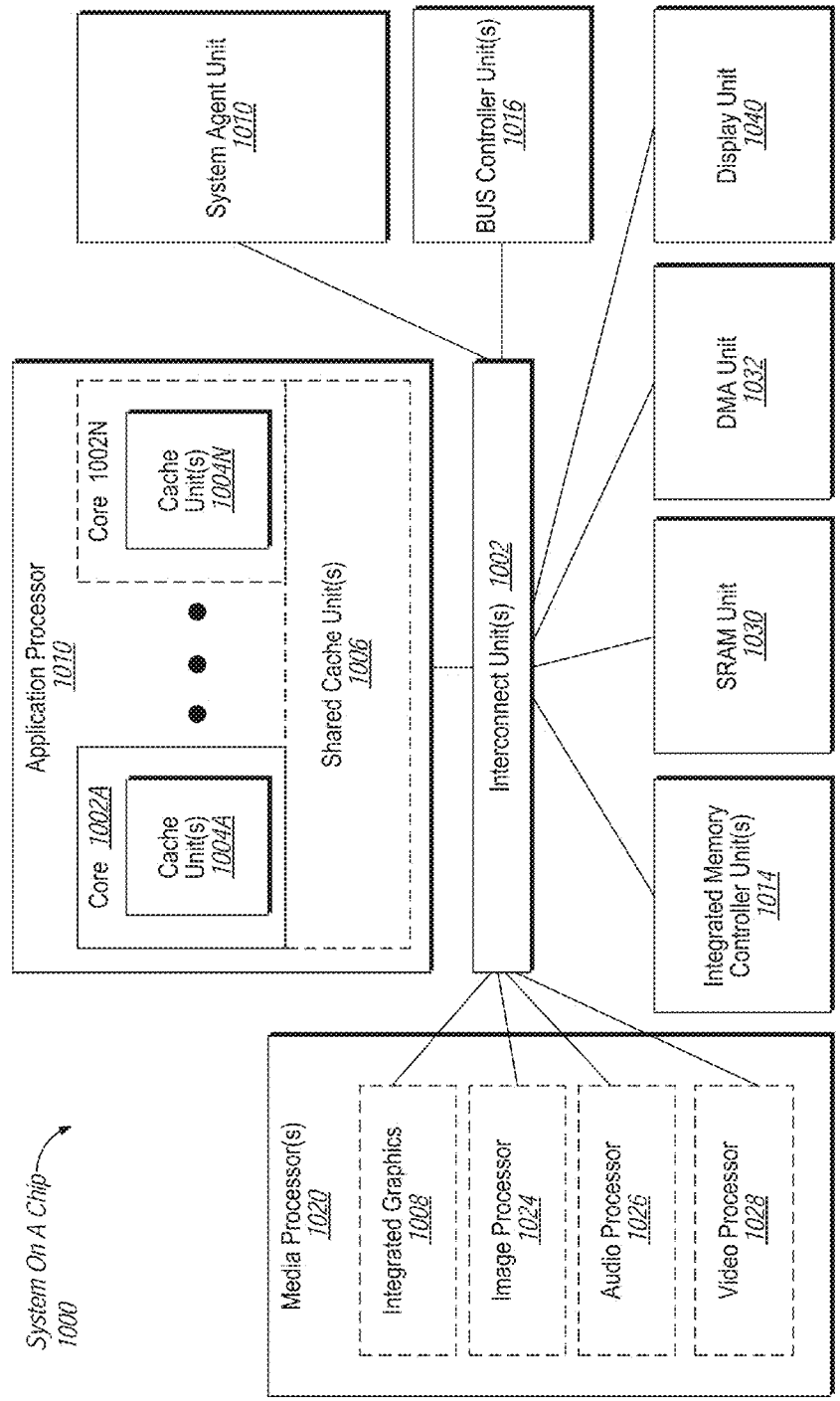
FIG. 10 is a block diagram of a System-on-a-Chip (SoC) in accordance with an embodiment of the present disclosure

Embodiments may be implemented in many different system types. FIG. 10 is a block diagram of a SoC 1000 in accordance with an embodiment of the present disclosure. Dashed lined boxes are optional features on more advanced SoCs. In FIG. 10, an interconnect unit(s) 1012 is coupled to: an application processor 1020 which includes a set of one or more cores 1002A-N and shared cache unit(s) 1006; a system agent unit 1010; a bus controller unit(s) 1016; an integrated memory controller unit(s) 1014; a set or one or more media processors 1018 which may include integrated graphics logic 1008, an image processor 1024 for providing still and/or video camera functionality, an audio processor 1026 for providing hardware audio acceleration, and a video processor 1028 for providing video encode/decode acceleration; an static random access memory (SRAM) unit 1030; a direct memory access (DMA) unit 1032; and a display unit 1040 for coupling to one or more external displays. In one embodiment, a memory module may be included in the integrated memory controller unit(s) 1014. In another embodiment, the memory module may be included in one or more other components of the SoC 1000 that may be used to access and/or control a memory. The application processor 1020 may include a store address predictor for implementing hybrid cores as described in embodiments herein.

The memory hierarchy includes one or more levels of cache within the cores, a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof.

In some embodiments, one or more of the cores 1002A-N are capable of multi-threading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the integrated graphics logic 1008. The display unit is for driving one or more externally connected displays.

The cores 1002A-N may be homogenous or heterogeneous in terms of architecture and/or instruction set. For example, some of the cores 1002A-N may be in order while others are out-of-order. As another example, two or more of the cores 1002A-N may be capable of execution the same instruction set, while others may be capable of executing only a subset of that instruction set or a different instruction set.

The application processor 1020 may be a general-purpose processor, such as a Core™ i3, i5, i7, 2 Duo and Quad, Xeon™, Itanium™, Atom™ or Quark™ processor, which are available from Intel™ Corporation, of Santa Clara, Calif. Alternatively, the application processor 1020 may be from another company, such as ARM Holdings™, Ltd, MIPS™, etc. The application processor 1020 may be a special-purpose processor, such as, for example, a network or communication processor, compression engine, graphics processor, co-processor, embedded processor, or the like. The application processor 1020 may be implemented on one or more chips. The application processor 1020 may be a part of and/or may be implemented on one or more substrates using any of a number of process technologies, such as, for example, BiCMOS, CMOS, or NMOS.

Figure 11:
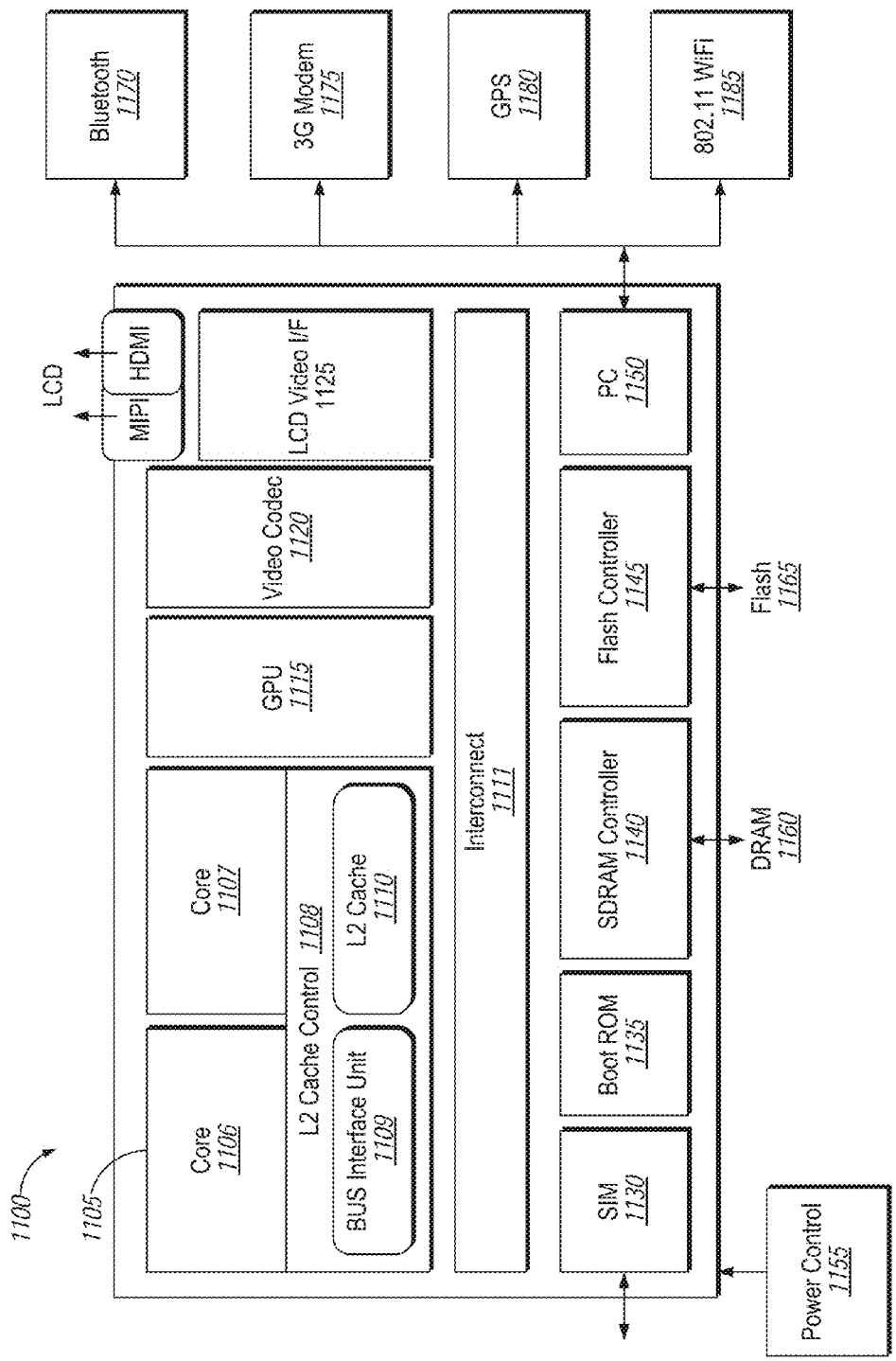
FIG. 11 is a block diagram of an embodiment of an SoC design in accordance with the present disclosure.

FIG. 11 is a block diagram of an embodiment of a system on-chip (SoC) design in accordance with the present disclosure. As a specific illustrative example, SoC 1100 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1100 includes 2 cores—1106 and 1107. Cores 1106 and 1107 may conform to an Instruction Set Architecture, such as an Intel® Architecture Core™, based processor, an Advanced Micro Devices, Inc. (AMD) processor, a MIPS-based processor, an ARM-based processor design, or a customer thereof, as well as their licensees or adopters. Cores 1106 and 1107 are coupled to cache control 1108 that is associated with bus interface unit 1109 and L2 cache 1110 to communicate with other parts of system 1100. Interconnect 1110 includes an on-chip interconnect, such as an IOSF, AMBA, or other interconnect discussed above, which potentially implements one or more aspects of the described disclosure. In one embodiment, cores 1106, 1107 may implement hybrid cores as described in embodiments herein.

Interconnect 1110 provides communication channels to the other components, such as a Subscriber Identity Module (SIM) 1130 to interface with a SIM card, a boot ROM 1135 to hold boot code for execution by cores 1106 and 1107 to initialize and boot SoC 1100, a SDRAM controller 1140 to interface with external memory (e.g. DRAM 1160), a flash controller 1145 to interface with non-volatile memory (e.g. Flash 1165), a peripheral control 1150 (e.g. Serial Peripheral Interface) to interface with peripherals, video codecs 1120 and Video interface 1125 to display and receive input (e.g. touch enabled input), GPU 1115 to perform graphics related computations, etc. Any of these interfaces may incorporate aspects of the disclosure described herein. In addition, the system 1100 illustrates peripherals for communication, such as a Bluetooth module 1170, 3G modem 1175, GPS 1180, and Wi-Fi 1185.

Figure 12:
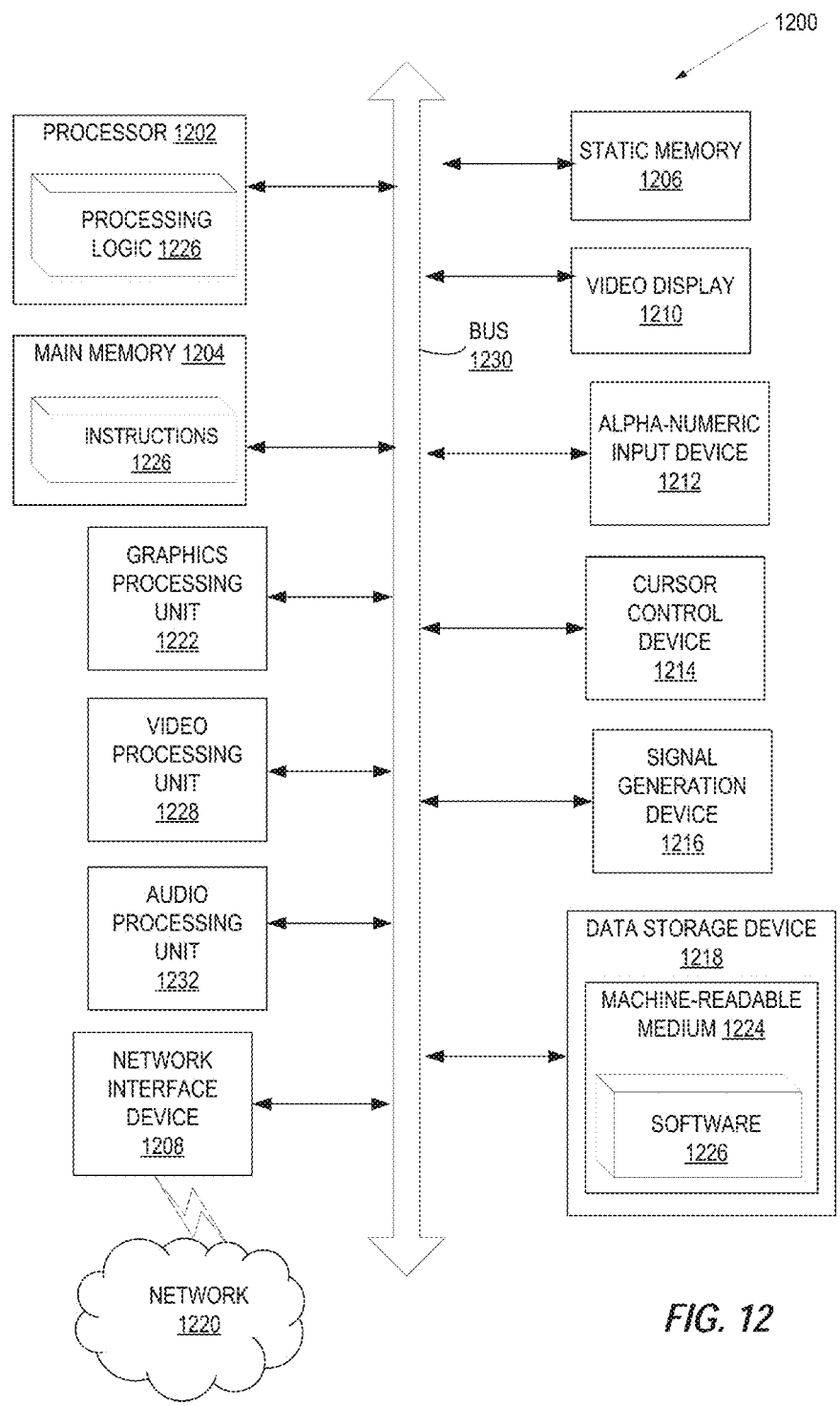
FIG. 12 illustrates a block diagram of one embodiment of a computer system.

FIG. 12 illustrates a diagrammatic representation of a machine in the example form of a computer system 1200 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 1200 includes a processing device 1202, a main memory 1204 (e.g., read-only memory (ROM), flash memory, dynamic random access memory (DRAM) (such as synchronous DRAM (SDRAM) or DRAM (RDRAM), etc.), a static memory 1206 (e.g., flash memory, static random access memory (SRAM), etc.), and a data storage device 1218, which communicate with each other via a bus 1230.

Processing device 1202 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. In one embodiment, processing device 1202 may include one or processing cores. The processing device 1202 is configured to execute the processing logic 1226 for performing the operations and steps discussed herein. In one embodiment, processing device 1202 is the same as processor architecture 100 described with respect to FIG. 1 as described herein with embodiments of the disclosure.

The computer system 1200 may further include a network interface device 1208 communicably coupled to a network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker). Furthermore, computer system 1200 may include a graphics processing unit 1222, a video processing unit 1228, and an audio processing unit 1232.

The data storage device 1218 may include a machine-accessible storage medium 1224 on which is stored software 1226 implementing any one or more of the methodologies of functions described herein, such as implementing store address prediction for memory disambiguation as described above. The software 1226 may also reside, completely or at least partially, within the main memory 1204 as instructions 1226 and/or within the processing device 1202 as processing logic 1226 during execution thereof by the computer system 1200; the main memory 1204 and the processing device 1202 also constituting machine-accessible storage media.

The machine-readable storage medium 1224 may also be used to store instructions 1226 implementing store address prediction for hybrid cores such as described according to embodiments of the disclosure. While the machine-accessible storage medium 1128 is shown in an example embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instruction for execution by the machine and that cause the machine to perform any one or more of the methodologies of the present disclosure. The term "machine-accessible storage medium" shall accordingly be taken to include, but not be limited to, solid-state memories, and optical and magnetic media.

The following examples pertain to further embodiments. Example 1 is a processing device comprising a storage device to store data and a processor, operably coupled to the storage device, the processor to receive a token stream comprising a plurality of tokens generated based on a byte stream comprising a plurality of bytes, wherein each token in the token stream comprises at least one symbol associated with a respective byte in the byte stream, and wherein the at least one symbol represents one of the respective byte, a length of a first byte string starting from the respective byte, or a byte distance between the first byte string and a matching second byte string, generate a graph comprising a plurality of nodes and edges based on the token stream, wherein each token in the token stream is associated with a respective node connected by at least one edge to another node, and wherein the at least one edge is associated with a cost function to encode the at least one symbol stored in the each token, identify, based on the graph, a path between a first node associated with a beginning token of the token stream and an end node associated with a last token of the token stream, wherein the path comprises a subset of nodes and edges linking the subset of nodes, and perform variable-length encoding of a subset of tokens associated with the subset of nodes to generate an output data.

In Example 2, the subject matter of Example 1 can optionally provide that the processor is further to receive the byte stream comprising the plurality of bytes as an input data, wherein the processor is further to store the output data in the storage device, and wherein the variable-length encoding comprises Huffman encoding.

In Example 3, the subject matter of any Examples 1 and 2 can optionally provide that the first byte string comprises at least three bytes starting from the respective byte.

In Example 4, the subject matter of Example 1 can further include a functional processing unit, operably coupled to the processor, the functional processing unit is to receive the byte stream from the processor and produce the token stream, wherein the token stream comprises at least as many tokens as a number of bytes in the byte stream.

In Example 5, the subject matter of any Examples 1 and 4 can optionally provide that the functional processing unit is to, for each byte in the byte stream, determine whether the first byte string starting from a first byte position of the respective byte matches the second byte string starting from a second byte position prior to the first byte position, responsive to determining that the first byte string matches the second byte string, generate a token comprising a first symbol comprising the length of the first byte string and a second symbol comprising the byte distance between the first byte position and the second byte position, responsive to determining that the first byte string does not match another byte string, generate the token comprising at least one of the first symbol comprising the each byte or a second symbol comprising a zero, and produce the token stream comprising the token.

In Example 6, the subject matter of Example 5 can optionally provide that determining whether the first byte string matches the second byte string comprises determining a longest byte string that matches the first byte string.

In Example 7, the subject matter of Example 5 can optionally provide that the functional processing unit is further to produce at least one additional token associated with the each byte, and wherein determining whether the first byte string matches the second byte string comprises determining a shortest byte distance to the first byte string for a pre-determined string length, and wherein the byte distance between two byte strings is defined as a byte distance between starting byte of these two byte strings.

In Example 8, the subject matter of Example 1 can optionally provide that to associate the cost function to encode the at least one symbol, the processor is to determine a first token position of the respective token comprising the at least one symbol and calculate the cost function as a function of the first token position in the token stream.

In Example 9, the subject matter of any of Examples 1 and 8 can optionally provide that the cost function defines a number of bits employed to encode the at least one symbol, and wherein the calculated cost function comprises extra bits in addition to bits used to encode the at least one symbol.

In Example 10, the subject matter of Example 9 can optionally provide that the processor is to identify the path based on a least-cost criterion.

In Example 11, the subject matter of Example 10 can optionally provide that the processor is further to responsive to having performed the variable-length encoding, determine a number of bits used to encode the at least one symbol stored in each token in the subset of tokens, update the cost function to encode the at least one symbol stored in each token in the subset of tokens based on the number of bits used, identify, based on the graph, a second path between the first node and the end node, wherein the second path comprises a second subset of nodes, and perform the variable-length encoding of a second subset of tokens associated with the second subset of nodes to generate a second output data.

In Example 12, the subject matter of Example 11 can optionally provide that the processor is further to update the cost function until the number of bits used to encode the at least one symbol converges to a fixed number.

Example 13 is a method comprising receiving, by a processor, a token stream comprising a plurality of tokens generated based on a byte stream comprising a plurality of bytes, wherein each token in the token stream comprises at least one symbol associated with a respective byte in the byte stream, and wherein the at least one symbol represents one of the respective byte, a length of a first byte string starting from the respective byte, or a byte distance between the first byte string and a matching second byte string, generating a graph comprising a plurality of nodes and edges based on the token stream, wherein each token in the token stream is associated with a respective node connected by at least one edge to another node, and wherein the at least one edge is associated with a cost function to encode the at least one symbol stored in the each token, identifying, based on the graph, a path between a first node associated with a beginning token of the token stream and an end node associated with a last token of the token stream, wherein the path comprises a subset of nodes and edges linking the subset of nodes, and performing variable-length encoding of a subset of tokens associated with the subset of nodes to generate an output data.

In Example 14, the subject matter of Example 13 can further comprise receiving the byte stream comprising the plurality of bytes as an input data and storing the output data in a storage device.

In Example 15, the subject matter of any of Examples 13 and 14 can optionally provide that the first byte string comprises at least three bytes starting from the respective byte.

In Example 16, the subject matter of Example 13 can further comprise transmitting the byte stream to a functional processing unit, wherein the functional processing unit is to, for each byte in the byte stream, determine whether the first byte string starting from a first byte position of the respective byte matches the second byte string starting from a second byte position prior to the first byte position, responsive to determining that the first byte string matches the second byte string, generate a token comprising a first symbol comprising the length of the first byte string and a second symbol comprising the byte distance between the first byte position and the second byte position, responsive to determining that the first byte string does not match another byte string, generate the token comprising at least one of the first symbol comprising the each byte or a second symbol comprising a zero, and produce the token stream comprising the token, and receiving the token stream from the functional processing unit.

In Example 17, the subject matter of any of Examples 13 and 16 can optionally provide that to determine whether the first byte string matches the second byte string, the functional processing unit is to determine a longest byte string that matches the first byte string.

In Example 18, the subject matter of Example 13 can further comprise determining a first token position of the respective token comprising the at least one symbol and calculating the cost function as a function of the first token position in the token stream.

In Example 19, the subject matter of any of Examples 13 and 18 can further comprise identifying the path based on a least-cost criterion.

In Example 20, the subject matter of Example 19 can further comprise responsive to having performed the variable-length encoding, determining a number of bits used to encode the at least one symbol stored in each token in the subset of tokens, updating the cost function to encode the at least one symbol stored in each token in the subset of tokens based on the number of bits used, identifying, based on the graph, a second path between the first node and the end node, wherein the second path comprises a second subset of nodes, and performing the variable-length encoding of a second subset of tokens associated with the second subset of nodes to generate a second output data.

Example 21 is an apparatus comprising: means for performing the subject matter of any of Examples 13 to 15.

Example 22 is a machine-readable non-transitory medium having stored thereon program codes that, when executed, perform operations comprising receiving, by the processor, a token stream comprising a plurality of tokens generated based on a byte stream comprising a plurality of bytes, wherein each token in the token stream comprises at least one symbol associated with a respective byte in the byte stream, and wherein the at least one symbol represents one of the respective byte, a length of a first byte string starting from the respective byte, or a byte distance between the first byte string and a matching second byte string, generating a graph comprising a plurality of nodes and edges based on the token stream, wherein each token in the token stream is associated with a respective node connected by at least one edge to another node, and wherein the at least one edge is associated with a cost function to encode the at least one symbol stored in the each token, identifying, based on the graph, a path between a first node associated with a beginning token of the token stream and an end node associated with a last token of the token stream, wherein the path comprises a subset of nodes and edges linking the subset of nodes, and performing variable-length encoding of a subset of tokens associated with the subset of nodes to generate an output data.

In Example 23, the subject matter of Example 22 can further comprise receiving the byte stream comprising the plurality of bytes as an input data and storing the output data in a storage device.

Example 24 is a system-on-a-chip (SoC) comprising a processor to receive a byte stream comprising a plurality of bytes, and a functional processing unit, operably coupled to a processor, to receive the byte stream, for each byte in the byte stream, determine whether a first byte string starting from a first byte position of the each byte matches a second byte string starting from a second byte position prior to the first byte position, responsive to determining that the first byte string matches the second byte string, generate a token comprising a first symbol comprising a length of the first byte string and a second symbol comprising a byte distance between the first byte position and the second byte position, responsive to determining that the first byte string does not match another byte string, generate the token comprising the first symbol comprising the byte and a second symbol comprising a zero, and produce, for the processor, the token stream comprising the token.

In Example 25, the subject matter of Example 24 can optionally provide that the processor is to receive the token stream from the functional processing unit, generate a graph comprising a plurality of nodes and edges based on the token stream, wherein each token in the token stream is associated with a respective node connected by at least one edge to another node, and wherein the at least one edge is associated with a cost function to encode the first symbol and the second symbol stored in the token, identify, based on the graph, a path between a first node associated with a beginning token of the token stream and an end node associated with a last token of the token stream, wherein the path comprises a subset of nodes and edges linking the subset of nodes, and perform a variable-length encoding of a subset of tokens associated with the subset of nodes to generate an output data.

While the disclosure has been described with respect to a limited number of embodiments, those skilled in the art will appreciate numerous modifications and variations there from. It is intended that the appended claims cover all such modifications and variations as fall within the true spirit and scope of this disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 910 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A processing device comprising:
    an accelerator circuit to:
        identify a byte in a byte stream;
        determine whether a first byte string starting from a first byte position of the byte matches a second byte string starting from a second byte position;
        responsive to determining that the first byte string matches the second byte string, generate a token comprising a first symbol encoding a length of the first byte string and a second symbol encoding a byte distance between the first byte position and the second byte position; and
        responsive to determining that the first byte string does not match another byte string, generate the token comprising the first symbol comprising the byte and a second symbol encoding a determined value.

2. The processing device of claim 1, further comprising a processor communicatively coupled to the accelerator circuit, wherein the accelerator circuit is further to:
    receive, from the processor, the byte stream comprising a plurality of bytes; and
    output a token stream comprising the token to the processor.

3. The processing device of claim 2, wherein the accelerator circuit is further to produce the token stream, wherein the token stream comprises at least as many tokens as a number of bytes in the byte stream.

4. The processing device of claim 2, wherein the processor is to:
    receive the token stream from the accelerator circuit;
    generate a graph comprising a plurality of nodes and edges based on the token stream, wherein each token in the token stream is associated with a respective node connected by at least one edge to another node, and wherein the at least one edge is associated with a cost function to encode the first symbol and the second symbol stored in the token;
    identify, based on the graph, a path between a first node associated with a beginning token of the token stream and an end node associated with a last token of the token stream, wherein the path comprises a subset of nodes and edges linking the subset of nodes; and
    perform a variable-length encoding of a subset of tokens associated with the subset of nodes to generate an output data.

5. The processing device of claim 4, wherein the accelerator circuit is to:
    for each respective byte in the byte stream, determine whether the first byte string starting from a first byte position associated with the respective byte matches the second byte string starting from a second byte position prior to the first byte position;
    responsive to determining that the first byte string matches the second byte string, generate a corresponding token associated with the first byte string, the corresponding token comprising a first symbol comprising the length of the first byte string and a second symbol comprising the byte distance between the first byte position and the second byte position; and
    responsive to determining that the first byte string does not match another byte string, generate the corresponding token comprising the first symbol comprising the respective byte and a second symbol comprising the determined value.

6. The processing device of claim 5, wherein determining whether the first byte string matches the second byte string comprises determining a longest byte string that matches the first byte string.

7. The processing device of claim 5, wherein the accelerator circuit is further to produce at least one additional token associated with the each respective byte, wherein to determine whether the first byte string matches the second byte string, the accelerator circuit is to determine a shortest byte distance to the first byte string for a determined string length, and wherein the byte distance between two byte strings is defined as a byte distance between starting bytes of these two byte strings.

8. The processing device of claim 4, wherein to associate the cost function to encode the at least one symbol, the processor is to:
    determine a first token position of the respective token comprising the at least one symbol; and
    calculate the cost function as a function of the first token position in the token stream.

9. The processing device of claim 8, wherein the cost function defines a number of bits employed to encode the at least one symbol, and wherein the cost function comprises extra bits in addition to bits used to encode the at least one symbol.

10. The processing device of claim 4, wherein the processor is to identify the path based on a least-cost criterion.

11. The processing device of claim 10, wherein the processor is further to:
    responsive to having performed the variable-length encoding, determine a number of bits used to encode the at least one symbol stored in each token in the subset of tokens;
    update the cost function to encode the at least one symbol stored in each token in the subset of tokens based on the number of bits used;
    identify, based on the graph, a second path between the first node and the end node, wherein the second path comprises a second subset of nodes; and
    perform the variable-length encoding of a second subset of tokens associated with the second subset of nodes to generate a second output data.

12. The processing device of claim 11, wherein the processor is further to update the cost function until the number of bits used to encode the at least one symbol converges to a fixed number.

13. The processing device of claim 1, wherein the determined value is zero.

14. A method comprising:
    identifying, by an accelerator circuit, a byte in a byte stream;
    determining whether a first byte string starting from a first byte position of the byte matches a second byte string starting from a second byte position;

responsive to determining that the first byte string matches the second byte string, generating a token comprising a first symbol encoding a length of the first byte string and a second symbol encoding a byte distance between the first byte position and the second byte position; and responsive to determining that the first byte string does not match another byte string, generating the token comprising the first symbol comprising the byte and a second symbol encoding a determined value.

15. The method of claim 14, further comprising:

receiving, from a processor, the byte stream comprising a plurality of bytes; and outputting a token stream comprising the token to the processor.

16. The method of claim 15, wherein the first byte string comprises at least three bytes starting from the respective byte.

17. The method of claim 16, further comprising:

producing the token stream, wherein the token stream comprises at least as many tokens as a number of bytes in the byte stream.

18. The method of claim 14, further comprising:

for each respective byte in the byte stream, determining whether the first byte string starting from a first byte position associated with the respective byte matches the second byte string starting from a second byte position prior to the first byte position;

responsive to determining that the first byte string matches the second byte string, generating a corresponding token associated with the first byte string, the corresponding token comprising a first symbol comprising the length of the first byte string and a second symbol comprising the byte distance between the first byte position and the second byte position; and responsive to determining that the first byte string does not match another byte string, generating the corresponding token comprising the first symbol comprising the respective byte and a second symbol comprising the determined value.

19. The method of claim 18, wherein to determine whether the first byte string matches the second byte string, the accelerator circuit is to determine a longest byte string that matches the first byte string.

20. A processing device to:

receive a token stream comprising a plurality of tokens generated based on a byte stream comprising a plurality of bytes, wherein each token in the token stream comprises at least one symbol associated with a respective byte in the byte stream, and wherein the at least one symbol represents one of the respective byte, a length of a first byte string starting from the respective byte, or a byte distance between the first byte string and a matching second byte string;

generate a graph comprising a plurality of nodes and edges based on the token stream, wherein each token in the token stream is associated with a respective node connected by at least one edge to another node, and wherein the at least one edge is associated with a cost function to encode the at least one symbol stored in the each token;

identify, based on the graph, a path between a first node associated with a beginning token of the token stream and an end node associated with a last token of the token stream, wherein the path comprises a subset of nodes and edges linking the subset of nodes; and perform variable-length encoding of a subset of tokens associated with the subset of nodes to generate an output data.

* * * * *